United States Patent
Kerr et al.

(10) Patent No.: US 7,772,042 B2
(45) Date of Patent: Aug. 10, 2010

(54) SOLVENT SOFTENING TO ALLOW DIE PLACEMENT

(75) Inventors: Roger S. Kerr, Brockport, NY (US); Timothy J. Tredwell, Fairport, NY (US); Seung-Ho Baek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/236,848

(22) Filed: Sep. 24, 2008

(65) Prior Publication Data
US 2010/0071930 A1 Mar. 25, 2010

(51) Int. Cl.
*H01L 21/00* (2006.01)
(52) U.S. Cl. .......... 438/118; 438/127; 438/458
(58) Field of Classification Search ........... 438/106, 438/118, 127, 458; 257/E21.001
See application file for complete search history.

(56) References Cited

U.S. PATENT DOCUMENTS

| | | | |
|---|---|---|---|
| 3,655,496 | A | 4/1972 | Ettre et al. |
| 4,571,826 | A | 2/1986 | Jacobs |
| 5,833,073 | A | 11/1998 | Schatz et al. |
| 5,856,662 | A | 1/1999 | Kohama et al. |
| 6,029,427 | A | 2/2000 | Freund et al. |
| 7,195,733 | B2 | 3/2007 | Rogers et al. |
| 2004/0020036 | A1 | 2/2004 | Arneson et al. |
| 2005/0005434 | A1 | 1/2005 | Arneson et al. |
| 2005/0199584 | A1 | 9/2005 | Nuzzo et al. |
| 2005/0229799 | A1 | 10/2005 | Kito |
| 2006/0084012 | A1 | 4/2006 | Nuzzo et al. |
| 2006/0263930 | A1* | 11/2006 | Ito .......................... 438/106 |
| 2007/0032089 | A1 | 2/2007 | Nuzzo et al. |

FOREIGN PATENT DOCUMENTS

| | | |
|---|---|---|
| WO | 2005122285 | 12/2005 |
| WO | WO 2008/087995 A1 | 7/2008 |

OTHER PUBLICATIONS

Ouellette, Jennifer, "Exploiting Molecular Self-Assembly," 28 The Industrial Physicist, American Institute of Physics, Dec. 2000, 3 Pages.

Usami, Mitsuo et al., "Powder LSI: An Ultra Small RF Identification Chip for Individual Recognition Applications," 2003 IEEE International Solid-State Circuits Conference, IEEE/ISSCC 2003 Visuals Supplement, pp. 326, 327 and 579.

* cited by examiner

*Primary Examiner*—Jack Chen
(74) *Attorney, Agent, or Firm*—Nelson Adrian Bush

(57) ABSTRACT

Exemplary embodiments provide methods and systems for assembling electronic devices, such as integrated circuit (IC) chips, by selectively and seating IC elements onto/into a receiving substrate, such as a chip substrate. Specifically, the assembly of IC chips can include embedding IC elements onto the receiving substrate upon softening the receiving substrate. Such softening can be performed by using a softening agent and/or an activatable thermal barrier material. In an exemplary embodiment, pockets can be formed in the receiving substrate using the activatable thermal barrier material for the IC assembly.

10 Claims, 3 Drawing Sheets

SOLVENT SOFTENING TO ALLOW DIE PLACEMENT

FIELD OF THE INVENTION

This invention relates generally to assembly of semiconductor devices and, more particularly, to the assembly of integrated circuit elements.

BACKGROUND OF THE INVENTION

As market demand increases for integrated circuit (IC) products such as radio frequency identification (RFID) tags, and as IC die sizes shrink, high assembly throughput rates for very small die and low production costs are crucial in providing commercially-viable products. For example, the cost of an RFID device still depends on assembly complexity.

Conventional methods for assembling IC products include pick and place techniques. Such techniques involve a manipulator, such as a robot arm, to remove IC dies from a wafer and place them into a die carrier. The dies are subsequently mounted onto a substrate with other electronic components, such as antennas, capacitors, resistors, and inductors to form an electronic device. However, these techniques have drawbacks and disadvantages. For example, the pick and place techniques involve complex robotic components and control systems that handle only one die at a time. In addition, pick and place techniques have limited placement accuracy, and have a minimum die size requirement.

Thus, there is a need to overcome these and other problems of the prior art and to provide controllable methods for a scalable and low cost assembly in transferring and assembling electronic device elements with chip substrates.

SUMMARY OF THE INVENTION

In accordance with the present teachings, a method for assembling integrated circuits is provided.

The exemplary method can include providing a chip substrate; selectively softening one or more portions of the chip substrate by a surface treatment; positioning one or more IC elements that are attached to a release layer with respect to the chip substrate such that each IC element contacts a corresponding softened portion of the chip substrate; and embedding each IC element into the corresponding softened portion of the chip substrate.

In accordance with the present teachings, an integrated circuit assembly is provided.

The exemplary assembly can include a chip substrate selectively softened at one or more portions thereof by a surface treatment; and one or more released IC elements embedded into the corresponding softened portion of the chip substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
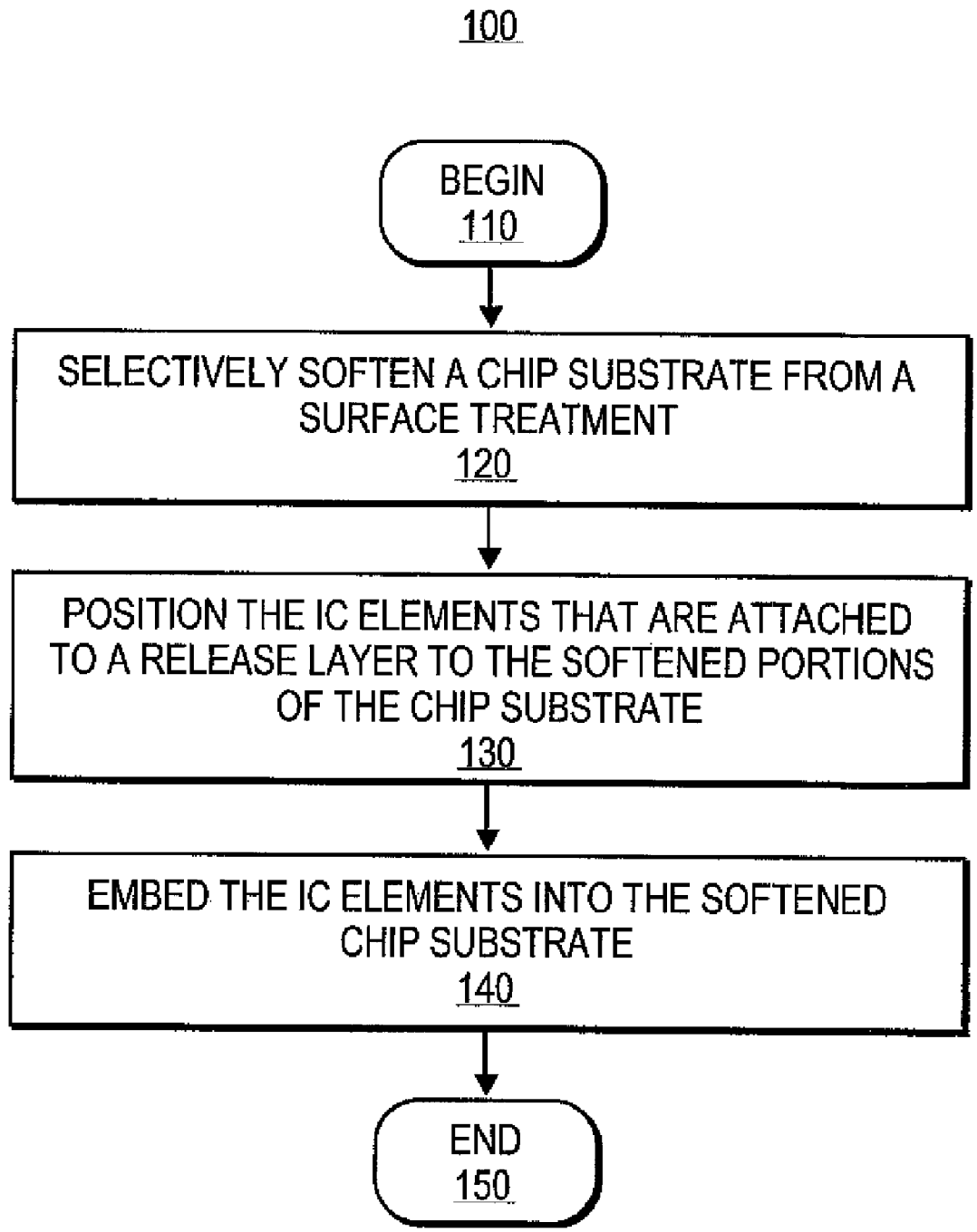
FIG. 1 depicts an exemplary method for a "bump side up" assembly of IC elements in a chip substrate in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10 e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

Exemplary embodiments provide methods and systems for assembling electronic devices, such as integrated circuit (IC) chips. For example, IC elements/components can be selectively and scalably transferred and assembled (e.g., embedded) within a receiving material such as an intermediate substrate or a final chip substrate to form IC chips. As disclosed herein, exemplary IC elements can include, but are not limited to, display elements, detector elements, processor elements, or any other IC elements as would be understood by one of ordinary skill in the art.

For ease of illustration, the invention will be described with reference to an assembly of IC chips in an exemplary form of radio frequency identification (RFID) chips. RFID chips can be used in various applications, such as inventory control, airport baggage monitoring, as well as security and surveillance applications for location monitoring and real time tracking of such items. Generally, an RFID chip can include, e.g., a plurality of die elements (dies) mounted onto related supporting electronics that can be located on a chip substrate. The plurality of dies can be an integrated circuit that performs RFID operations known to one of ordinary skill in the art, such as communicating with one or more chip readers according to various interrogation protocols of RFID. Each die can further include conductive connections to electrically contact with the chip supporting electronics. The conductive connections of each die can include, for example, conductive traces, such as conductive ink traces, or conductive bumps or bumps attached to a strap.

Even further, it will be appreciated the placement of die on a surface can be such that the die are magnetically aligned prior to subsequent processing. An example of the magnetic alignment of the die is disclosed in, for example commonly owned published application number 2006-0131504, and incorporated herein by reference in its entirety.

When assembling RFID chips, the die can be mounted, for example, in either a "bump side up" or "bump side down" orientation. As used herein, the terms "bump side up" and "bump side down" denote alternative implementations of the plurality of dies. In particular, these terms designate the orientation of connection bumps in relation to a subsequent surface to be transferred and assembled. That is, in a "bump side up" orientation, the plurality of dies can be transferred to the subsequent surface with bumps facing away from the subsequent surface. In a "bump side down" orientation, the plurality of dies can be transferred to the subsequent surface with bumps facing towards, and in contact with the subsequent surface. In various embodiments, the subsequent surface can be a receiving surface that includes, for example, an intermediate transfer surface, or an actual final chip substrate to which the dies can be permanently attached. In various embodiments, the subsequent surface can be rigid or flexible and can be formed of a material chosen from, for example, plastic, silicon wafer, etc., for either the intermediate transfer substrate or a final chip substrate.

As disclosed herein, the assembly of IC elements (e.g., the dies for RFID chips) can include releasing the IC elements from a release layer, transferring them onto a receiving surface (e.g., a chip substrate surface) and accommodating (e.g., embedding) them within the receiving surface. In addition, the embedded IC elements can be locally encapsulated.

The "release layer" can be in a form of, for example, a web, a film, a plate, a roll, and their various combinations, to which the IC elements can be attached. The release layer can be a rigid release layer or a flexible release layer. As used herein, the term "flexible" refers to the ability of a material, structure, device or device component to be deformed into a curved shape without undergoing a transformation that introduces significant strain, such as strain characterizing the failure point of a material, structure, device, or device component. The release layer can therefore include, but is not limited to, a flexible web, flexible film, flexible plate, flexible roll (including a roll-to-roll), and their various combinations. In addition, the term "release layer" can provide a large releasing area, for example, such as a 2-meter squared releasing area and as much as an entire surface of the web or roll. Accordingly, a large area transferring and receiving onto/into the chip substrate can be selectively performed.

In various embodiments, the IC elements can be attached to the release layer through a functional surface formed on a release support. The functional surface can be adhesive to initially hold the attached IC elements in place and can further provide an easy release when necessary. For example, the functional surface can include a phase-change surface or an adhesive surface formed on the release support. In one example, the release layer can include a phase-change surface that provides an adhesive surface when the IC elements contact therewith and further provides a phase-change when exposed to an energy source such as a laser. This phase change can be used to release the attached IC elements from the release layer and transfer the IC elements onto a receiving surface such as a chip substrate surface. In another example, the release layer can be a sticky tape such as a green tape or a blue tape known in industry or can include an epoxy, glue, or wax applied on a release support to provide surface adhesiveness and further to provide easy removal of the attached IC elements.

The chip substrate can be rigid or flexible and can include a material including, for example, a plastic. The term "plastic" refers to any synthetic or naturally occurring material or combination of materials that can be molded or shaped, generally when heated and hardened into a desired shape. Exemplary plastics useful in assembling IC chips can include, but are not limited to, polymers, resins and/or cellulose derivatives. In an additional example, the plastics useful in assembling IC chips can include polyester, polystyrene, ABS, acrylic, polycarbonate and PVC. The term "plastic" is further intended to include composite plastic materials including one or more plastics with one or more additives, such as structural enhancers, fillers, fibers, plasticizers, stabilizers, and/or additives which may provide desired chemical or physical properties. Other suitable materials can be used for the chip substrate including, but not limited to metal, glass, and coated metal.

In various embodiments, the assembly of IC chips can include, for example, softening the receiving surface to accommodate the IC elements into the receiving material (see FIGS. 1-2). For example, the softening of the chip substrate can be performed by using a solvent softening agent.

FIG. 1 and FIGS. 2A-2G depict exemplary methods and systems for assembling IC elements in a chip substrate using various softening techniques for a "bump side up" assembly in accordance with the present teachings. Specifically, FIG. 1 depicts an exemplary method 100 for transferring IC elements into a chip substrate in accordance with the present teachings.

As used herein unless otherwise specified, the terms "soften" and "softening" refer to a molecular chain progress of a solid material, for example, at any transitional stages/points from a solid state into a liquid-like or liquid state (e.g., fusion or ablation). The softening can further include a gradually decreasing in viscosity for an amorphous substance or a melting of a crystalline solid. The softening process can be conducted, for example, by applying a solvent softening agent to a solid material such as a plastic.

The method 100 of FIG. 1 begins at 110. At 120, the chip substrate can be selectively softened from a surface treatment. The surface treatment can include, for example, selectively applying (e.g., depositing or coating) a softening agent on surface of a chip substrate for softening one or more portions of the chip substrate. In various embodiments, the softening agent can be selectively applied on a common chip substrate to selectively soften multiple portions of the common chip substrate.

In various embodiments, the softening agent can be selectively applied onto the chip substrate using a printing process. As use herein, the term "print" uses its ordinary meaning recognized in the art. For example, a printing process can be used to produce arbitrary patterns of material dots, such as a patterned softening agent, with or without an array of printing studs on a receiving surface, for example, on surface of a chip substrate. The printing process can provide high throughput and provide selectivity of the geometry and distribution of the printed materials.

At 230, one or more IC elements that are attached to a release layer can be positioned closely adjacent to the chip substrate such that each IC element contacts a corresponding softened portion of the chip substrate. Therefore, the one or more IC elements can have a first surface attached to the release layer and have a second surface contacted with the softened chip substrate.

At 240, the IC elements can be assembled in the chip substrate by embedding each IC element in the corresponding softened portion of the chip substrate. In various embodiments, a suitable compressive pressure can be applied onto the release layer attached to the first surface of the IC elements to push the IC elements into the softened portions of the chip substrate. Other suitable means can also be used to facilitate the embedment of the IC elements into the chip substrate. For example, when the softening agent is used to soften the chip substrate, a heating means can be used individually or in combination with the pressure means to evaporate the softening agent and to rearrange movement of substrate molecular chains.

In various embodiments, the acts of releasing, softening, transferring, and assembling of the one or more IC elements illustrated in the method 100 can be performed simultaneously in a successive manner using such as a flexible roll to roll process. In various embodiments, the embedded IC elements using the softening agent can be flush with the surface of the chip substrate or below the surface of the chip substrate. The method 100 can conclude at 150 in FIG. 1.

FIGS. 2A-2G depict an exemplary process for assembling IC chips using a softening agent to selectively soften a chip substrate in accordance with the present teachings. The process depicted in FIG. 2 is performed generally according to one embodiment of the method 100 in FIG. 1. When the softening agent is applied (e.g., printed) on an exemplary plastic chip substrate, the softening agent can temporarily and locally soften and/or partially dissolve the plastic at room temperature or at an enhanced temperature. When this occurs, the plastic chains can be free to move in the liquid-like and/or the liquid plastic. Other components, such as IC elements, can thus be pushed in and assembled (e.g., embedded) in the exemplary softened plastic.

The softening agent can include, for example, an organic solvent including, but not limited to, methylethylketone, acetone, toluene, xylene, and styrene monomer. In various embodiments, the use of combinations of plastics and/or the use of combinations of softening agents can be contemplated. For example, polystyrene and acrylic can be mixed together to form a plastic substrate. In addition, the use of combinations of a plastic and a softening agent (e.g., a solvent for a plastic or a mixed plastic, and/or a mixed solvent for a plastic or a mixed plastic) can be contemplated. For example, a polystyrene plastic chip substrate can be softened by a softening agent including methylethylketone.

In various embodiments, the exposure time of the softening agent to the exemplary plastic substrate, the temperature and/or the pressure applied for softening can independently or dependently affect the softening process. For example, a relatively longer period of time of the softening agent exposing the chip substrate can produce a deeper softening effect, which can, in turn, require less pressure to compress the IC elements into the substrate or not require the addition of heat in some applications or softening agent-plastic combinations.

Figure 2A:
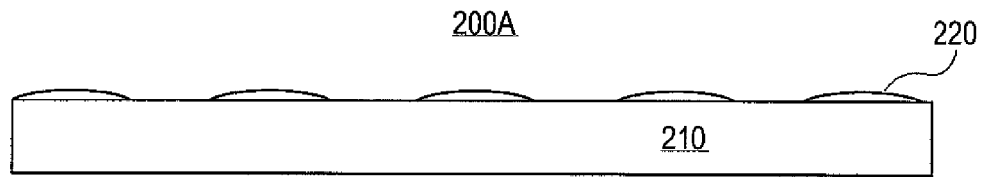
FIGS. 2A-2G depict an exemplary process at various stages according to the method depicted in FIG. 1 in accordance with the present teachings.

In FIG. 2A, the device 200A includes a chip substrate 210 and a plurality of softening agents 220 selectively applied (e.g., printed) thereon. The softening agent 220 can include a disclosed organic solvent which is related to the material used for the chip substrate depending on particular IC applications. The softening agent 220 can be printed by a suitable printing technique, such as an ink jet printing, known to one of ordinary skill in the art and can be printed with desired arrays or patterns depending on specific applications. When the softening agent 220 comes into contact with various portions of the chip substrate 210, the chip substrate 210 can become selectively softened to form one or more softened portions of the chip substrate 210. In various embodiments, the printed softening agent 220 can have a setting (e.g., exposure) time on the chip substrate 210 for a desired softening effect following the printing process and prior to the subsequent process such as coupling with IC elements.

Figure 2B:
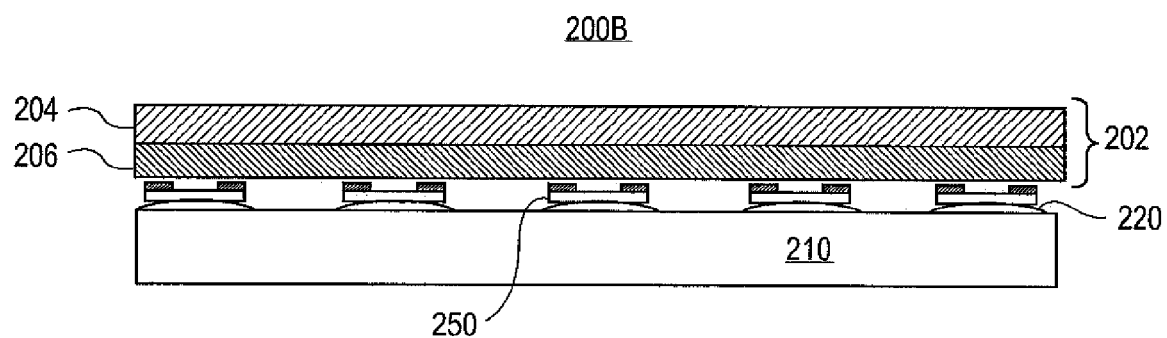

In FIG. 2B, one or more IC elements, such as, one or more RFID dies 250 that are attached to a release layer 202 can be provided for an RFID chip assembly. For example, the one or more RFID dies 250 can be positioned with respect to the chip substrate 210 such that each RFID die 250 can contact a corresponding printed softening agent 220 or a corresponding softened portion of the chip substrate 210.

Figure 2C:
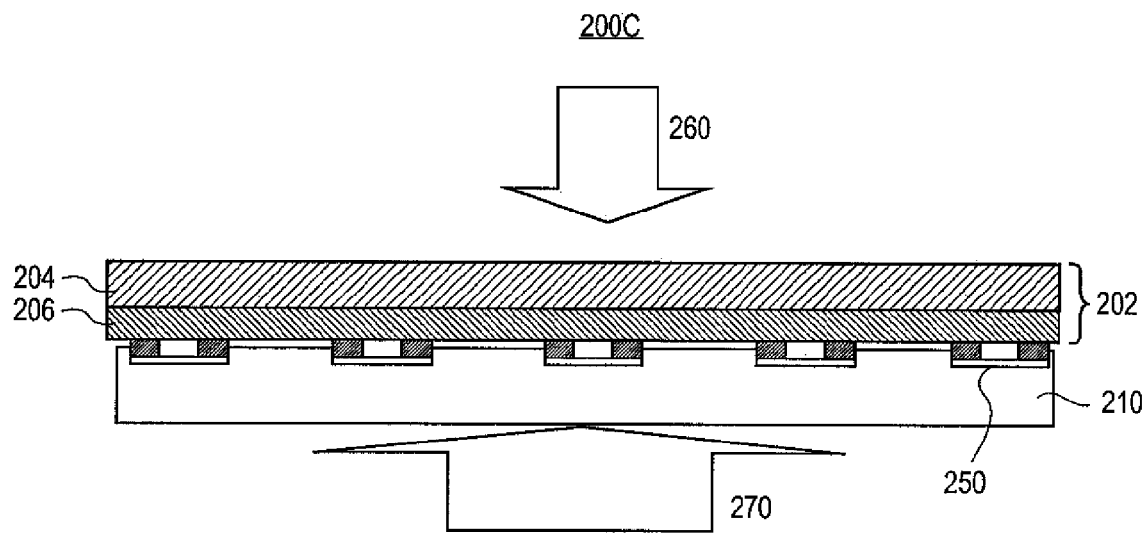

In FIG. 2C, each RFID die 250 can be embedded into the corresponding softened portion of the chip substrate 210. In an exemplary embodiment, a suitable compressive pressure can be applied at 260 on a release layer 202 to push each RFID die 250 into the corresponding softened portion. In another exemplary embodiment, heat can be applied at 270 to the joining area of the dies 250 with the softening agent 220 of each softened portion of the chip substrate 210 to evaporate the softening agent 220 and reform the chip material for embedding. In various embodiments, the applying of the compressive pressure at 260 and the heat at 270 can be performed sequentially or simultaneously on each die 250. Likewise, it will be appreciated that application of heat and/or pressure can be from the same side of the chip substrate 210 and further that application of heat and/or pressure as shown can be switched such that heat is applied, for example, from a different side of the substrate.

Figure 2D:
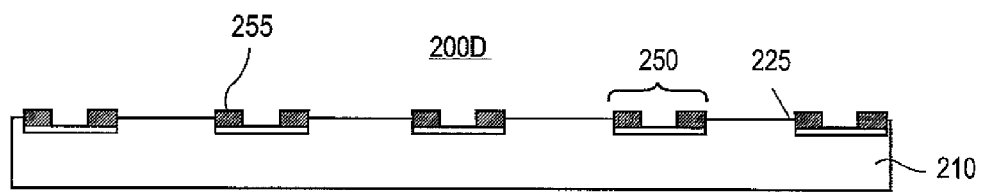

In FIG. 2D, to further complete the assembly of RFID chips, the release layer 202 of device 200C (see FIG. 2C) can be removed depending on the material used for a functional surface 206. For example, the release layer 202 can be easily removed by detaching a tape adhesive or by optically inducing a phase change when a phase change material is used for the functional surface 206. In this manner, the device 200D can include the one or more RFID dies 250 embedded into the softened portions 225 of the chip substrate 210, for example, in a bump side up manner.

Figure 2E:
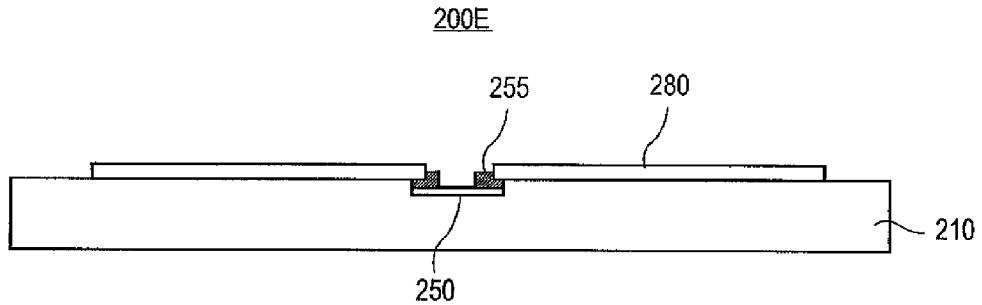

In FIG. 2E, supporting electronics, such as antennas 280, can be printed on the embedded RFID dies 250 as shown in device 200E. The antennas 280 can include various conductive materials such as metal, metal alloy or other known suitable conductive materials. The antennas 280 can be formed by, for example, sintering screen printed silver paste and/or sintering grauvere printed silver nanoparticles. The antennas 280 can have an electrical contact with a plurality of bump bonds 255 of each RFID die 250.

Figure 2F:
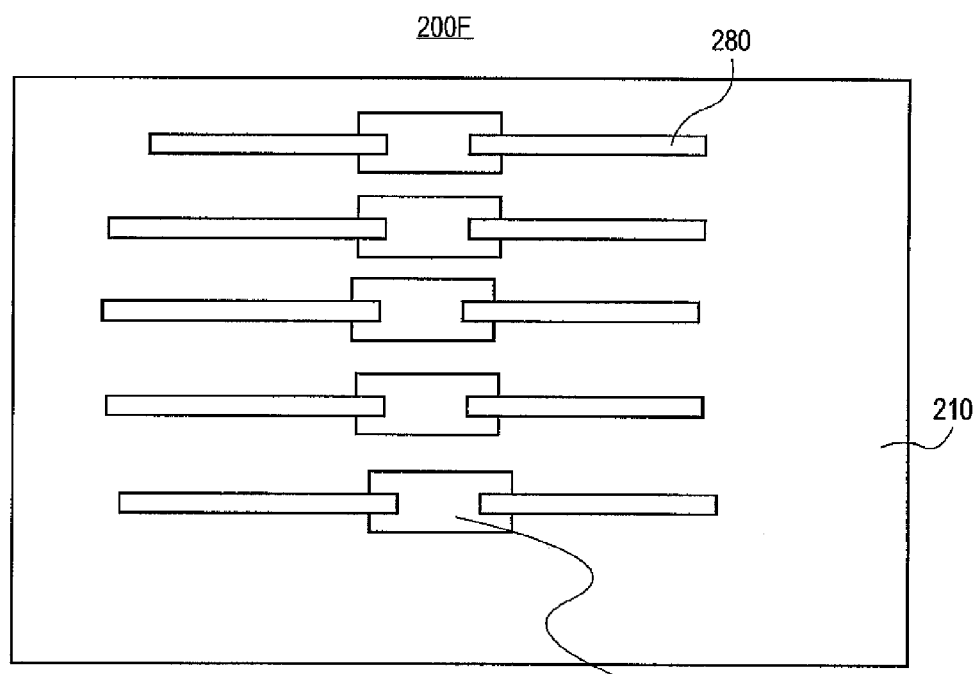

In FIG. 2F, the device 200F further shows a top view of the assembled RFID chip with a cross sectional view shown in FIG. 2E. The antennas 280 can have an electrical contact with the embedded RFID dies 250 through each bump bond.

Figure 2G:
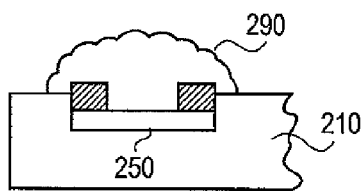

In FIG. 2G, an optional encapsulation of the embedded RFID dies 250 is depicted. Encapsulation can be performed at any stage after embedding of the RFID dies, and can be local to individually encapsulate only the RFID dies. Application of the encapsulation material 290 can be by printing in a manner similar to that described in connection with applying the solvent softening agent. The encapsulating material can be a curable clear or opaque material including, but not limited to, polyurethane, polyethylene, polypropylene, polystyrene, polyester, and epoxy, and combinations thereof.

It is noted that the disclosed methods and processes shown in FIGS. 1-2 can be "controllable" for selectively releasing, transferring, and/or assembling IC elements. For example, by controlling the softened area of the chip substrate, one or more selected IC elements or multiple IC elements can be assembled at the same time. In addition, the geometry and distribution of the released IC elements can be spatially controlled during the assembly.

It is also noted that the disclosed methods and processes shown in FIGS. 1-2 can be "controllable" for selectively screening (inspecting), and/or repairing during the assembling of the IC elements. For example, a group of the one or more IC elements that are attached to a release layer can be selected for an inspection using a suitable test circuitry. The inspected IC element that needs to be repaired can then be determined and selectively released from the release layer and selectively transferred and assembled to the chip substrate using the disclosed methods and processes for a subsequent individual or group repair.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for assembling integrated circuits (IC) comprising:
   providing a chip substrate;
   selectively softening one or more portions of the chip substrate by a surface treatment;
   positioning one or more IC elements that are attached to a release layer with respect to the chip substrate such that each IC element contacts a corresponding softened portion of the chin substrate;
   embedding each IC element into the corresponding softened portion of the chip substrate; and
   wherein the surface treatment comprises printing a softening agent on a surface of the chip substrate.

2. A method for assembling integrated circuits (IC) comprising:
   providing a chip substrate;
   selectively softening one or more portions of the chip substrate by a surface treatment;
   positioning one or more IC elements that are attached to a release layer with respect to the chip substrate such that each IC element contacts a corresponding softened portion of the chip substrate;
   embedding each IC element into the corresponding softened portion of the chip substrate; and
   wherein the surface treatment comprises printing a softening agent on a chip substrate for selectively softening one or more portions of the chip substrate.

3. The method of claim 1, further comprising locally encapsulating each embedded IC element.

4. The method of claim 1, further comprising printing supporting electronics onto the chip substrate, wherein the supporting electronics electrically contact each exposed IC element.

5. The method of claim 1, wherein the element is embedded flush with a surface of the chip substrate.

6. The method of claim 1, wherein the element is embedded below a surface of the chip substrate.

7. The method of claim 1, wherein the softening agent comprises an organic solvent.

8. The method of claim 1, wherein the chip substrate comprises a roll-to-roll material.

9. The method of claim 1, wherein the release layer comprises a roll-to-roll material.

10. The method of claim 1, wherein the substrate comprises plastic.

* * * * *